United States Patent
Emori et al.

[11] Patent Number: 5,940,272
[45] Date of Patent: Aug. 17, 1999

[54] ELECTRIC APPARATUS HAVING HEAT RADIATING FIN

[75] Inventors: Akihiko Emori, Hitachi; Hiroyuki Hanei, Chiba; Tsunehiro Endo, Narashino; Tomoyuki Someya; Masahiro Iwamura, both of Hitachi; Noboru Akiyama, Hitachinaka; Kazuo Kato, Ibaraki-ken, all of Japan

[73] Assignee: Hitachi, Ltd., Tokyo, Japan

[21] Appl. No.: 08/904,862

[22] Filed: Aug. 1, 1997

[30] Foreign Application Priority Data

Aug. 1, 1996 [JP] Japan .................................. 8-203420

[51] Int. Cl.⁶ .................................................. H05K 7/20
[52] U.S. Cl. ........................ 361/704; 361/683; 361/692; 361/752; 361/818; 257/722; 165/80.3; 165/185; 174/16.1; 174/35 R
[58] Field of Search ................................. 361/664, 683, 361/690–697, 700–721, 818, 736, 687, 752, 816, 704–709; 165/862, 80.3, 80.4, 104.14, 26, 33.34, 185; 174/16.3, 15.2, DIG. 2, 35 R, 252, 16.1; 257/706, 707, 722; 315/276; 340/693; 307/151; 335/202

[56] References Cited

U.S. PATENT DOCUMENTS

| | | | |
|---|---|---|---|
| 3,961,666 | 6/1976 | Suzuki et al. ............................ | 165/129 |
| 4,015,173 | 3/1977 | Nitsche . | |
| 5,050,039 | 9/1991 | Edfords ..................................... | 361/388 |
| 5,060,112 | 10/1991 | Cocconi ..................................... | 361/386 |
| 5,373,418 | 12/1994 | Hayasi ..................................... | 361/707 |
| 5,504,659 | 4/1996 | Acatay et al. ........................... | 361/816 |

FOREIGN PATENT DOCUMENTS

| | | |
|---|---|---|
| 0688053A1 | 1/1995 | European Pat. Off. . |
| 4410061A1 | 3/1994 | Germany . |

*Primary Examiner*—Leo P. Picard
*Assistant Examiner*—Michael Datskovsky
*Attorney, Agent, or Firm*—Antonelli, Terry, Stout & Kraus, LLP

[57] ABSTRACT

An electric apparatus has a plurality of electric parts and a casing made of electrically conductive material for accommodating therein or mounting thereon a plurality of electric parts. The casing, which has a cavity therein, is provided with a plurality of projections for radiating heat generated by the electric parts in the cavity. The casing is provided with openings for allowing a heat conductive medium to flow into and out of the casing. Further, an electric apparatus has a plurality of electric parts and a casing made of electrically conductive material for accommodating therein or mounting thereon a plurality of electric parts. The casing is provided with openings for allowing a heat conductive medium to flow into and out of the casing. The casing is provided therein with a partition wall which is made of electrically conductive material for dividing the interior of the casing into a plurality of zones along a direction of a flow of the heat conductive medium.

10 Claims, 9 Drawing Sheets

ELECTRIC APPARATUS HAVING HEAT RADIATING FIN

BACKGROUND OF THE INVENTION

The present invention relates to an electric apparatus which uses an electric part that is large in heat generation and that also becomes a source of generating electromagnetic noise and, in particular, to an electric apparatus which can be suitably used for an inverter, transformer or noise filter and can realize its size reduction, high heat radiating efficiency and high electromagnetic shielding properties.

There has been conventionally proposed an electric apparatus in which a casing (case) for accommodating therein an electric part providing a large quantity of heat generation is made of such heat conductive material as aluminum and the casing is provided on its outside with heat radiating fin parts.

Figure 12:
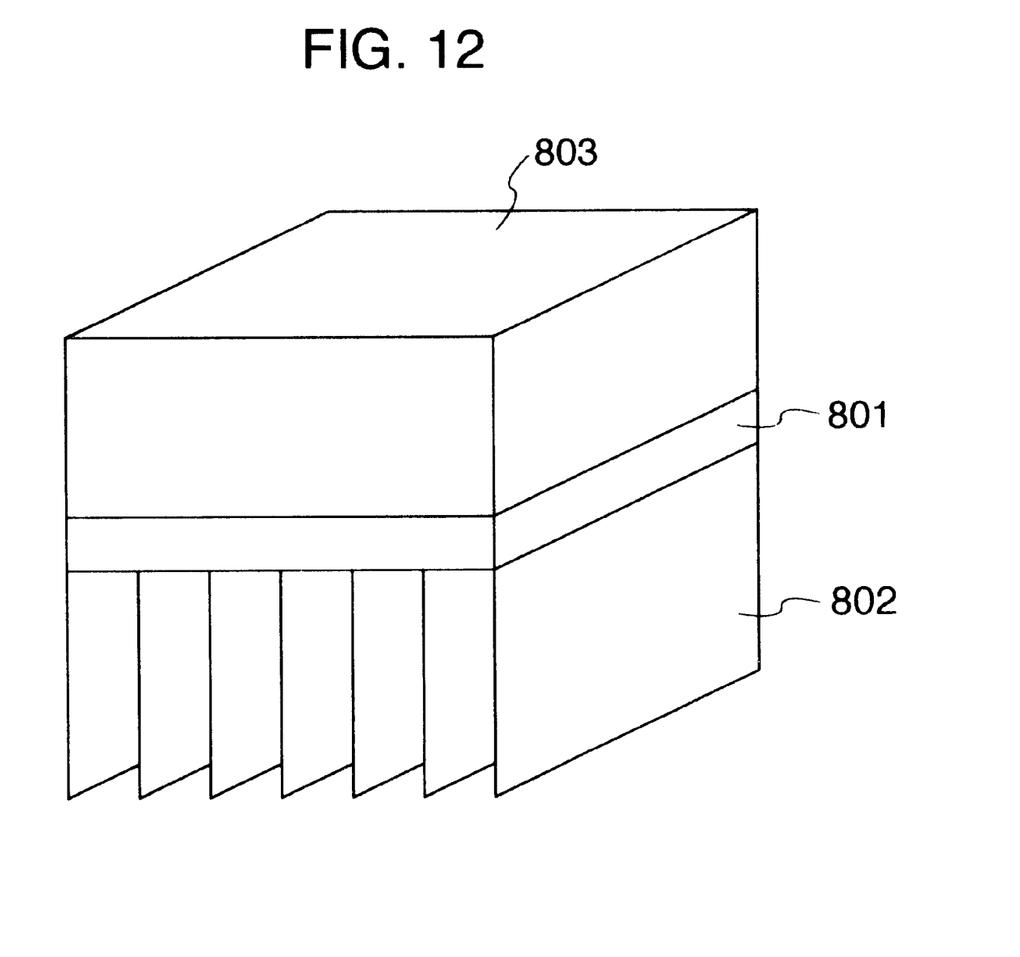
FIG. 12 shows a structure of a prior art heat radiating fin.

FIG. 12 is an outside appearance of an electric apparatus provided with a conventional heat radiating fin. In the drawing, reference numeral 801 denotes a base, numeral 802 denotes a fin part, and 803 denotes a main body casing. Mounted on an outside of the casing is the base 801 on which a row of many planar fin parts 802 are provided for heat radiation through the base 801 and the entire fin part row.

For the purpose of increasing its heat radiation efficiency, the conventional electric apparatus is arranged to make a surface area (heat radiation surface) of the heat radiation fin as wide as possible. For this reason, when an electric part providing a relatively large quantity of heat generation is used, there has occurred such a problem that a volume ratio of the fin parts to the entire volume of the electric apparatus becomes large and thus the apparatus becomes large in size.

In such an electric apparatus as an inverter or converter device using semiconductor switching elements such as GTOs (gate turn-off thyristors) or IGBTs (insulated gate bipolar transistors), there are many cases where electromagnetic noise externally radiated by the turning on and off operation of the switching element has an adverse influence on the other electronic parts within the apparatus or on electronic devices other than the apparatus.

Further, as the number of electronic devices and the number of types used increase, electromagnetic noise generated by these devices has been increased. To avoid this, it is required for the electric apparatus to have such a high electromagnetic immunity that prevents the apparatus from being erroneously operated in response to external incoming noise.

SUMMARY OF THE INVENTION

The present invention provides an electric apparatus which is high in heat radiation efficiency, excellent in electromagnetic shielding and immunity properties, and small in size.

In accordance with an aspect of the present invention, there is provided an electric apparatus which comprises a plurality of electric parts and a casing made of electrically conductive material for accommodating therein or mounting thereon the plurality of electric parts, and which is characterized in that the casing having a cavity therein is provided with a plurality of projections for radiating heat generated by the electric parts, and the casing is provided therein with openings for allowing a heat conductive medium to flow into and out of the casing.

In accordance with another aspect of the present invention, there is provided an electric apparatus which comprises a plurality of electric parts and a casing made of electrically conductive material for accommodating therein or mounting thereon the plurality of electric parts, and which is characterized in that the casing is provided therein with openings for allowing a heat conductive medium to flow into and out of the casing therethrough, and the casing is provided therein with a partition wall which is made of electrically conductive material for dividing an interior of the casing into a plurality of zones along a direction of a flow of the heat conductive medium.

DESCRIPTION OF THE PREFERRED EMBODIMENTS

Embodiments of the present invention will be detailed with reference to the accompanying drawings in which the same parts are denoted by an identical reference numeral.

Figure 1:
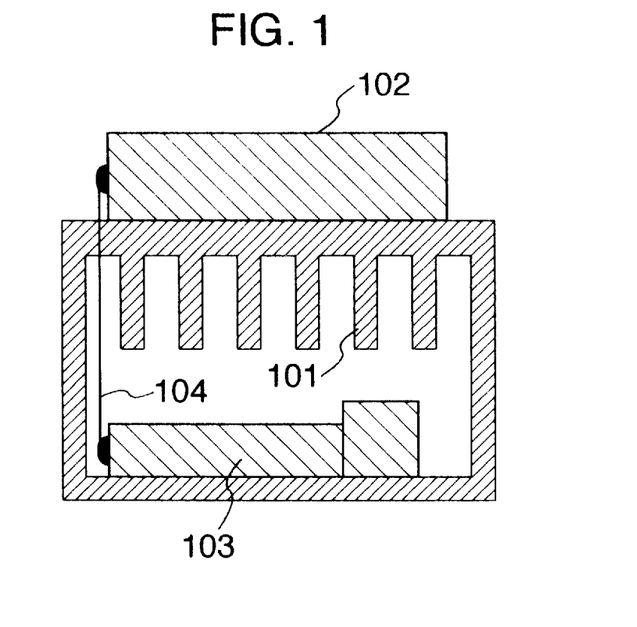
FIG. 1 shows a first embodiment of the present invention.

FIG. 1 shows a cross-sectional structure of a first embodiment of an electric apparatus of the present invention. A heat radiating fin 101 is made up of a casing part for housing therein a group of electric parts B103 and a fin part of a plurality of planar fin projections parallel to each other, the casing and fin projections being integrally formed. An electric part A102 having a relatively great amount of heat generation is mounted on an upper side (a side opposite to a fin mounting side) of a base of the radiation fin. The group of electric parts B103 includes an electric part which forms a source of generating electromagnetic noise and an electric part more susceptible to the influence of the electromagnetic noise. The electric part A102 and the group of electric parts B103 are electrically interconnected by means of an electric wire 104.

In the electric apparatus of the present invention, the fin part having a plurality of projected fins is provided on an inner side of the casing part on the side of a cavity inside thereof. In the embodiment of FIG. 1, the casing and planar fin part, which have the same cross-sectional shape, are extended in a direction perpendicular to the paper sheet plane and have openings (not shown) at their both sides. Such heat conductive medium as air flows through the interior of the casing in the direction perpendicular to the paper sheet plane to thereby cause heat generated by electric parts to be emitted from the openings to exterior of the electric apparatus. Spontaneous convection or provision of a blowing fan at the openings causes the heat conductive medium to flow through the interior of the casing. Heat generated by the electric parts as well as heat transmitted from the outer side of the casing and from the electric part mounted on the outer side of the casing are externally emitted.

In this way, the electric apparatus of the present embodiment can be made wide in its heat radiating area and large in its heat radiating efficiency. Further, since the casing and projected fin part are integrally molded, the casing and fin part can be made small in its thermal resistance and be further improved in its heat radiating efficiency.

Figure 5:
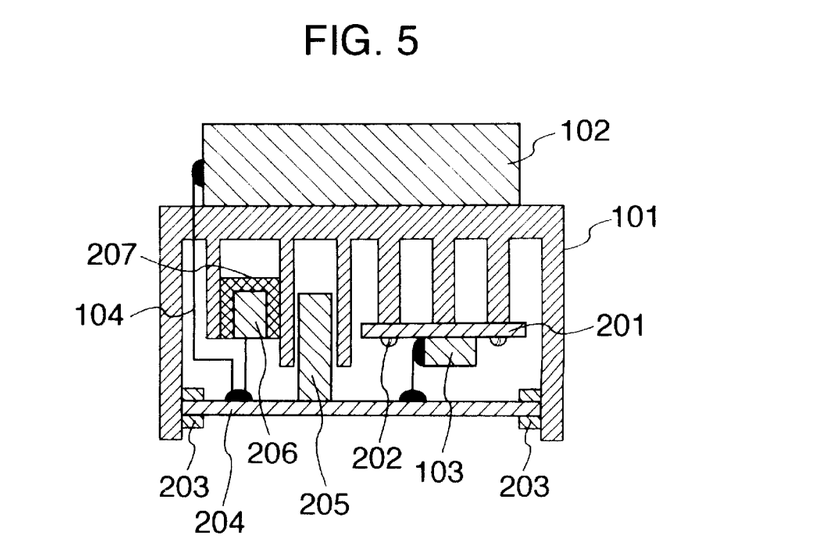
FIG. 5 shows a second embodiment of the present invention.

In the embodiment of FIG. 5, the electric part is directly mounted on the heat radiating fin 101, and the radiation fin also functions as a supporting member for carrying thereon a plurality of electric parts. For this reason, the total number of parts in the overall apparatus can be reduced and therefore the apparatus can be made small in size.

When the radiation fin 101 is made of electrically conductive material, for example, metal such as aluminum or a carbon/carbon composite, the group of electric parts B103 surrounded by the radiation fin 101 are electromagnetically shielded from the exterior. For this reason, when the group of electric parts B103 are more easily susceptible to the influence of externally-generated noise, damage thereof by the external incoming noise can be suppressed. When the group of electric parts B103 generate electromagnetic noise, the noise can be shielded by the radiation fin 101 to minimize the influences of the noise on the other devices. Further, when the radiation fin 101 is made of such magnetic material as ferrite, magnetic shielding can be established.

When the electric wire 104 is replaced by an optical fiber or coaxial cable for transmitting signals between the electric part A102 and the group of electric parts B103 therethrough, the influences of external electromagnetic noise on the above electric parts can be suppressed and externally-radiating electromagnetic noise can be further reduced.

When the radiation fin 101 is made of a carbon/rubber composite which is larger in elasticity than metal, the radiation fin 101 can have, in addition to the aforementioned function, another function of absorbing vibration and damping sound. This results in that mechanical vibration and noise in the electric apparatus can be suppressed.

The radiation fin 101 is manufactured by a die-casting, sheet metal working, injection molding or the like method. When it is desired to obtain a complicated shape, the fin manufacturing is effectively carried out by the die casting. Further, when the flowing direction of the heat conductive medium, or in other words, the cross-sectional shape in the direction perpendicular to the paper sheet plane is constant, use of the injection molding method make it easy to manufacture the fin, thereby reducing its manufacturing costs.

In the present embodiment, when the radiation fin 101 is made of, e.g., aluminum and when the electric part A102 is an inverter and the group of electric parts B103 is a noise filter, there can be realized an inverter apparatus which is small in its electromagnetic noise and large in its electromagnetic immunity. When the radiation fin 101 is made of a carbon/rubber composite and when the electric part A102 is a transformer and the group of electric parts B103 includes a relay and a control device therefor, further, there can be realized a switching power supply which avoids its erroneous operation caused by electromagnetic noise and produces less vibration and noise during operation of the relay.

As has been explained above, in accordance with the electric apparatus of the present embodiment, there can be realized an electric apparatus which is good in its heat radiating properties and small in external radiation of electromagnetic noise. The heat radiation and the electromagnetic noise radiation from the interior of the casing are carried out through the openings of the casing. Explanation will next be made as to a relationship between dimensions of the openings provided to the radiation fin 101 and the degree of heat radiation and electromagnetic shielding.

Figure 2:
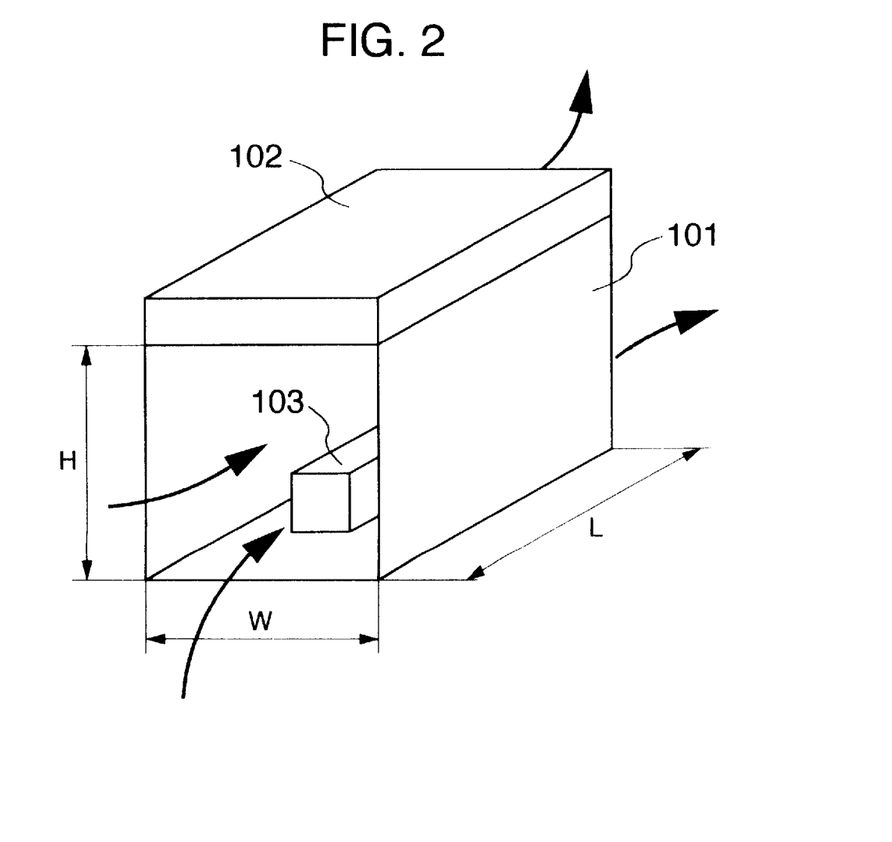
FIG. 2 is a diagram for defining dimensions of a heat radiating fin.

FIG. 2 shows dimensions of parts of the casing part of the radiation fin 101. It is assumed that L denotes a length of heat conductive medium in its flow direction of heat conductive medium indicated by arrows, H denotes a longitudinal dimension of a cross section of the casing vertical to the flowing direction, and W denotes a width dimension of the cross section thereof.

Figure 3:
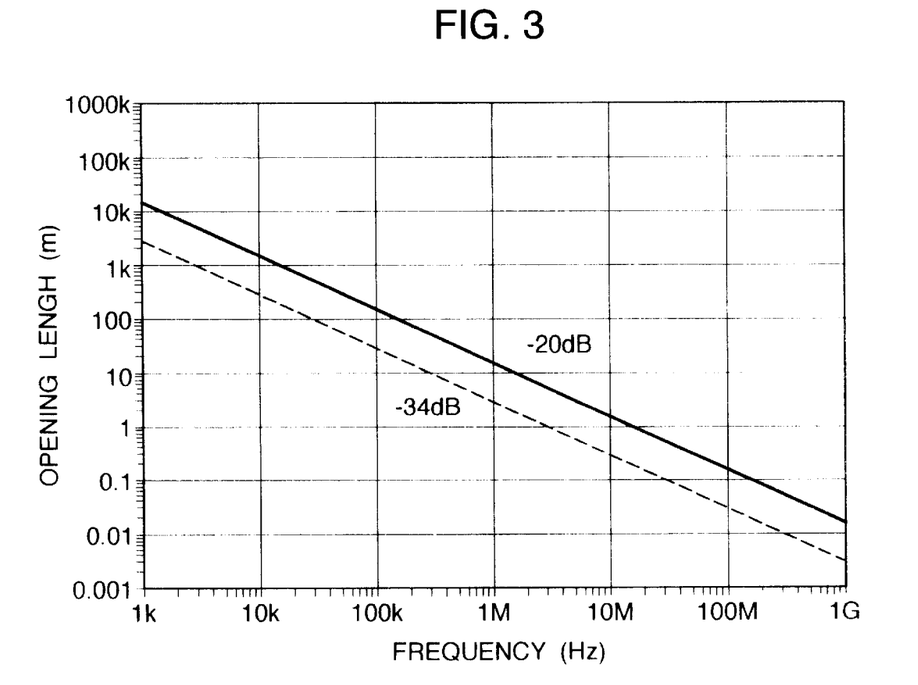
FIG. 3 is a diagram for explaining a relationship between an opening length of a slit and electromagnetic noise emitted therefrom.

FIG. 3 shows shielding effects of the radiation fin against electromagnetic noise externally radiated from the opening (which area being H×W) illustrated as located at a front side in FIG. 2, when an electromagnetic noise generation source is placed in the interior of the radiation fin 101. Ordinate denotes an opening length, i.e., a diagonal length of the opening having an area of H×W, and abscissa denotes frequency of the electromagnetic noise. Electromagnetic noise having a component having a wavelength (frequency) corresponding to the opening length leaks from the opening. In the drawing, a solid line denotes a maximum of the opening length providing a shielding effect of 20 dB with respect to each frequency of the electromagnetic noise, and a dotted line denotes a maximum of the opening length providing a shielding effect of 34 dB.

For example, when it is necessary to shield by 20 dB the electromagnetic noise up to 100 MHz, the opening length is required to be set to be 15 cm or less. When it is desired to shield by 34 dB, the opening length is required to be set to be 3 cm or less. Reversely, when the opening length is 15 cm, it is possible to obtain a shielding of 20 dB against the electromagnetic noise of up to 100 MHz.

Explanation will then be made as to a relationship between the shape of the radiation fin and the heat radiating effect of the radiation fin and the electromagnetic shielding effect of the radiation fin against electromagnetic noise radiated from the interior of the radiation fin.

Figure 4:
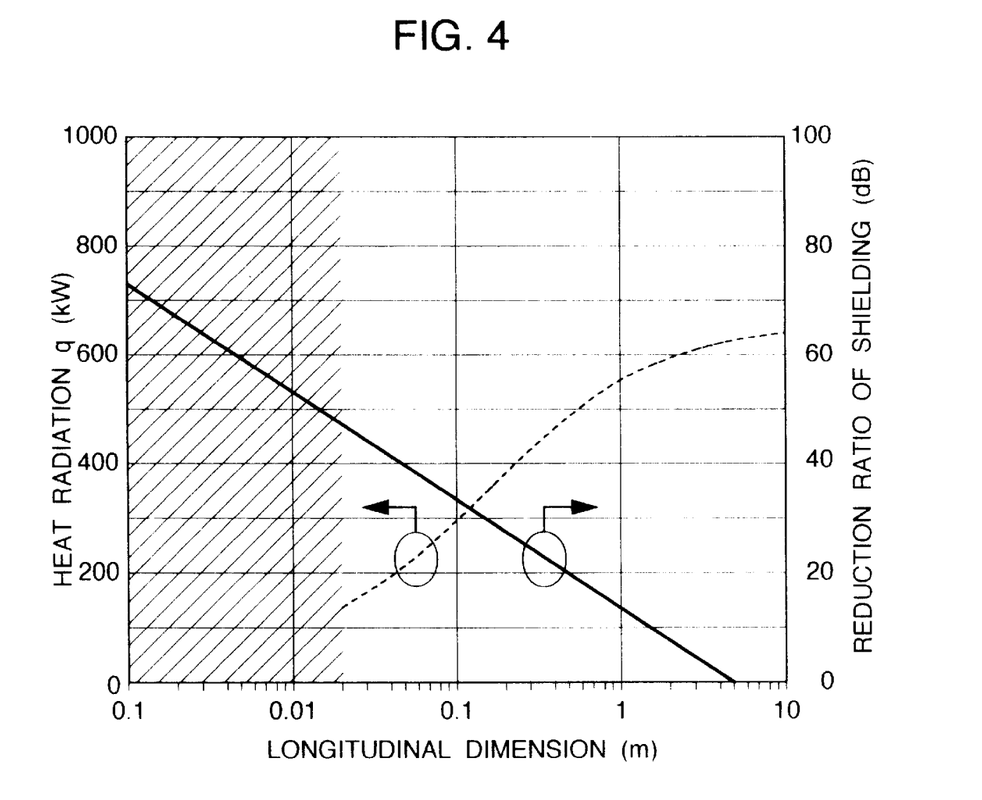
FIG. 4 shows a relationship between a longitudinal dimension, heat radiation and reduction ratio of shielding.

FIG. 4 shows a relationship between the longitudinal dimension H and heat radiation of the radiation fin 101 shown in FIG. 2 as well as a relationship between the longitudinal dimension H and a reduction ratio of shielding. In the drawing, the radiation fin was set to have the dimension L of 20 cm, the dimension W of 10 cm and a fin thickness t of 1 cm. It was also assumed that the radiation fin is made of aluminum (having a heat conduction ratio $\lambda T$ of $250W/(m \cdot K)$), a junction between the radiation fin and the electric part A102 having an amount of heat generation larger therethan has a temperature Ta of 120° C., the heat conductive medium (air) has a temperature Tb of 20° C., and a heat transfer coefficient h is $1000W/(m^2 \cdot K)$. It was further assumed that the group of electric parts B103 generate electromagnetic noise of 100 MHz. In the drawing, a solid line shows a relationship between the longitudinal dimension H and reduction ratio of shielding while a dotted line shows a relationship between the longitudinal dimension H and heat radiation.

Explanation will first be made as to the relationship between the longitudinal dimension H and heat radiation. When the longitudinal dimension is 30 cm or less, the heat radiation is proportional to the longitudinal dimension. When the longitudinal dimension is 10 cm or more, the heat radiation becomes 300 kW or more. Further, when the longitudinal dimension is 30 cm or more, the heat radiation exhibits a saturation tendency.

In general, when an area of the heat radiation surface of a heat radiator is denoted by A ($m^2$), heat radiation q is expressed by following equation (1).

$$q=KA(Ta-Tb) \tag{1}$$

Where, Ta denotes a temperature of a heating surface of a heat radiator heated thereby, Tb denotes a temperature of a heat conductive medium, and K denotes an overall heat transfer coefficient. The overall heat transfer coefficient K, a heat conduction ratio $\lambda T$ of the heat radiator, a distance X from the heating surface to the heat radiating surface, and a heat transfer coefficient h between the heat radiator and heat conductive medium satisfy a following equation (2).

$$1/K = X/\lambda T + 1/h \tag{2}$$

The area A of the heat radiation surface is increased as the longitudinal dimension H increases, whereas, the longitudinal dimension H is proportional to the heat radiation q. However, as the longitudinal dimension further increases, the quantity of heat propagating through the fin in the vertical direction is decreased and the quantity of heat radiation at the lower part of the fin is also decreased. This eventually results in that the total quantity of heat radiation is saturated. Explanation will next be made as to a relationship between the longitudinal dimension H and the reduction ratio of shielding of electromagnetic noise. The theory for opening face antenna is applied to the heat radiating fin having such a shape as shown in FIG. 2 to find a reduction ratio of shielding. Assume now that the opening has a face area of A ($m^2$), the electromagnetic noise has a wavelength of $\lambda$ (m), a gain coefficient is denoted by g. Then a reduction ratio of shielding G is approximated as a following equation (3).

$$G = \lambda^2/(4\pi HWg) \tag{3}$$

When $\lambda$, g and W are constant, the reduction ratio of shielding G is inversely proportional to the longitudinal dimension H of the opening of the radiation fin. When the longitudinal dimension H is 10 cm, the reduction ratio of shielding becomes 30 dB or more.

As has been mentioned above, the heat radiation q increases with increased longitudinal dimension H, whereas, the reduction ratio of shielding G decreases with the increased longitudinal dimension H of the radiation fin. Within a dimensional range of a typical electric apparatus, however, the reduction ratio of shielding can be made compatible with the heat radiation in a practical range.

FIG. 5 shows a cross-sectional structure of a second embodiment of the electric apparatus of the present invention. In the drawing, reference numeral 201 denotes a printed circuit board A, numeral 202 denotes a screw, 203 denotes a supporting piece, 204 denotes a printed circuit board B, 205 denotes an electric part C, 206 denotes an electric part D, and 207 denotes a fixing material.

Among fin parts of the radiation fin 101, the fin parts provided at both ends of the radiation fin are formed to be longer than the other fin parts to form part of the casing. The electric part A102 having a relatively large heat radiation is mounted on an outer side of the radiation fin 101 opposite to the plurality of fin parts. A group of electric parts B103 is mounted on the printed circuit board A201 so that terminals of the electric parts are electrically connected to a printed wiring pattern (not shown) of the printed circuit board. The printed circuit board A201 is fixedly mounted to tip ends of the fin parts by means of the screws 202. The electric part C205 is inserted into a gap defined by the adjacent fin parts of the radiation fin 101 to be connected and fixed to the printed circuit board B204. The electric part D206 is inserted into a gap defined by the adjacent fin parts other than the adjacent fin parts of the electric part C205 and then fixed by means of the fixing material 207. Terminals of the electric part C205 are connected to the printed circuit board B204. The printed circuit board B204 is fixed to the radiation fin 101 by means of the supporting pieces 203 integrally formed with the radiation fin 101. These electric parts and printed circuit board are electrically connected to each other by means of the electric wire 104.

The printed circuit board A201 is arranged to face the tip ends of the fin parts at its rear side or less part-projected side opposite to its part mounting face. This arrangement enables prevention of generation of a turbulent flow of air as the heat conductive medium flowing into and out of a space defined by the fin and printed circuit board A201, and thus enables achievement of efficient heat radiation.

The screws 202 are used to fasten parts each other or to electrically connect the parts and radiation fin 101 to each other. The screws may be replaced by an electrically conductive adhesive agent, a clamp or the like. The supporting pieces 203 are formed also to fasten the parts to each other or to electrically connect the parts and radiation fin 101 to each other. Only by sliding the printed circuit board in a direction perpendicular to the sheet plane, the printed circuit board can be fixed to the radiation fin. In place of the supporting pieces 203, other supporting parts such as screws or clamps may be used. When the supporting pieces 203 are integrally formed with the radiation fin 101, the numbers of parts and assembling steps can be reduced.

The electric part C205 is a part which is susceptible to electromagnetic noise or a part which generates much electromagnetic noise. Since this electric part is disposed between the adjacent fin parts, the fin parts defining the electric part can function as electromagnetic shielding members and can prevent electromagnetic interference between parts. Further, since electric parts are disposed in spaces defined between the fin parts, which spaces have been conventionally used only for heat radiation; the spaces can be effectively used, thus realizing a small-sized apparatus.

The fixing material 207 is material such as resin or adhesive agent which fastens electric parts. When an electric part to be fastened provides a large quantity of heat generation, a fixing material good in heat transfer property is employed, whereby heat generated by the electric part can be transmitted to the radiation fin and quickly radiated. When an electric part to be fastened is susceptible to heat, a fixing material having good heat insulating properties is used to thereby protect the electric part thermally.

Detailed explanation will next be made as to the principle of heat radiation and electromagnetic shielding in connection with a design example.

It is assumed that the electric part A102 has a bottom surface of longitudinal and lateral dimensions of each 10 cm, and the radiation fin 101 measures 10 cm long by 10 cm wide by 5 cm high and is made of aluminum. Also assumed is that a junction between the electric part A102 and the radiation fin 101 has a temperature of 70° C. with an ambient temperature of 20° C. and cooling is carried out based on spontaneous convection cooling.

When the radiation fin (101) is designed so that the radiation fin 101 provides a maximum heat radiation, an optimum interfin interval between the adjacent fin parts of the fin 101 is 6.306 mm, a sheet of fin part has a thickness of 0.784 mm, and the number of such fin parts is 15 (refer to a reference book entitled "Heat Conduction Handbook", Feb. 25, 1993, issued by The Japan Society of Mechanical Engineers, p. 118, p. 119). It goes without saying that the interfin spacing of 6.306 mm complies with dimensions of general electric parts.

Figure 6:
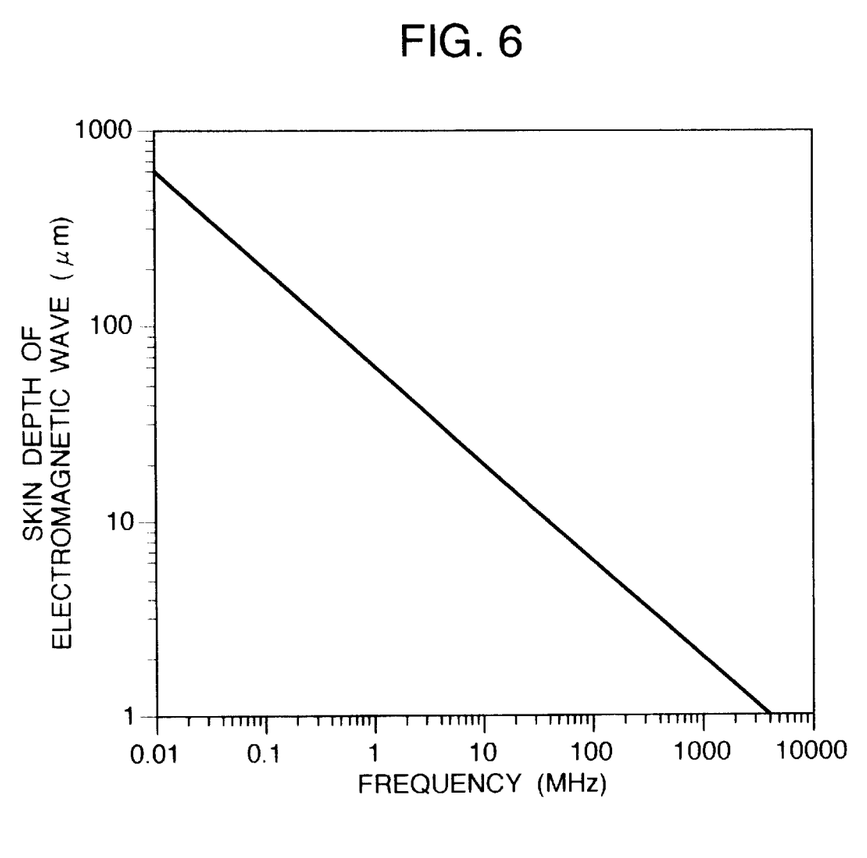
FIG. 6 shows a relationship between a skin depth of electromagnetic wave of an aluminum plate and frequency.

FIG. 6 shows a relationship between the skin depth of electromagnetic wave and frequency of an aluminum plate. When electromagnetic wave penetrates into an electric conductor, this causes the conductor to produce an eddy current, whereby the electromagnetic wave is attenuated. When the electromagnetic wave is subjected to an attenuation of 8.686 dB, a skin depth of electromagnetic wave δ is given by a following equation (4).

$$\delta = 1 / \sqrt{(\pi f \mu \sigma)} \quad (m) \qquad (4)$$

where, f denotes a frequency (Hz) of the electromagnetic wave, μ denotes a permeability (H/m) of the electric conductor, and δ denotes a conductivity (S/m) of the conductor.

In the drawing, the skin depth of electromagnetic wave δ of the aluminum plate is found in accordance with the above equation (4) with respect to each frequency of the electromagnetic wave. Further, a reduction ratio of shielding A is given by a following equation (5) using the skin depth of electromagnetic wave δ.

$$A = 8.686 \cdot t / \delta \quad (dB) \qquad (5)$$

where, t denotes the thickness (m) of the conductor.

Figure 7:
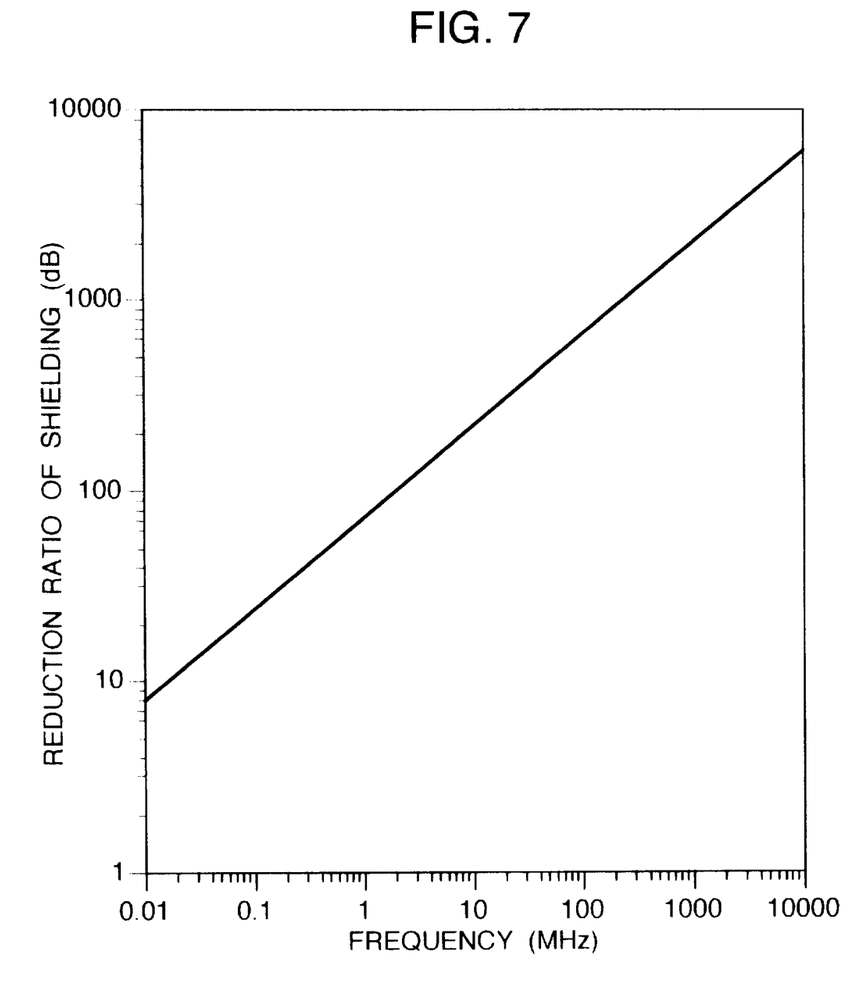
FIG. 7 shows a relationship between the reduction ratio of shielding of the aluminum plate having a thickness of 0.78 mm and frequency.

Shown in FIG. 7 is a result obtained by calculating a relationship between the reduction ratio of shielding and frequency of the aluminum plate having the thickness of 0.784 mm based on the above equation (5). It will be seen that a sheet of heat radiating fin part having the thickness of 0.784 mm designed to provide a maximum heat radiation in the above has a shielding effect of, e.g., 25 dB for the electromagnetic wave of 0.1 MHz. In the case where a plurality of such fin parts are provided and electric parts are disposed in spaces between the fin parts, reflection and absorption are repeated between the fin parts arranged in rows, which results in that the shielding effect can be further improved (multiple shielding).

As has been explained in the foregoing, in accordance with the present embodiment, good heat radiation and good electromagnetic shielding can be obtained in the same manner.

The radiation fin 101 can be manufactured by using the manufacturing method already explained in the first embodiment. In the present embodiment, when the electric part A102 is an inverter and another electric part is a noise filter, there can be provided an inverter apparatus which is small in generation of electromagnetic noise and large in electromagnetic immunity.

Figure 8:
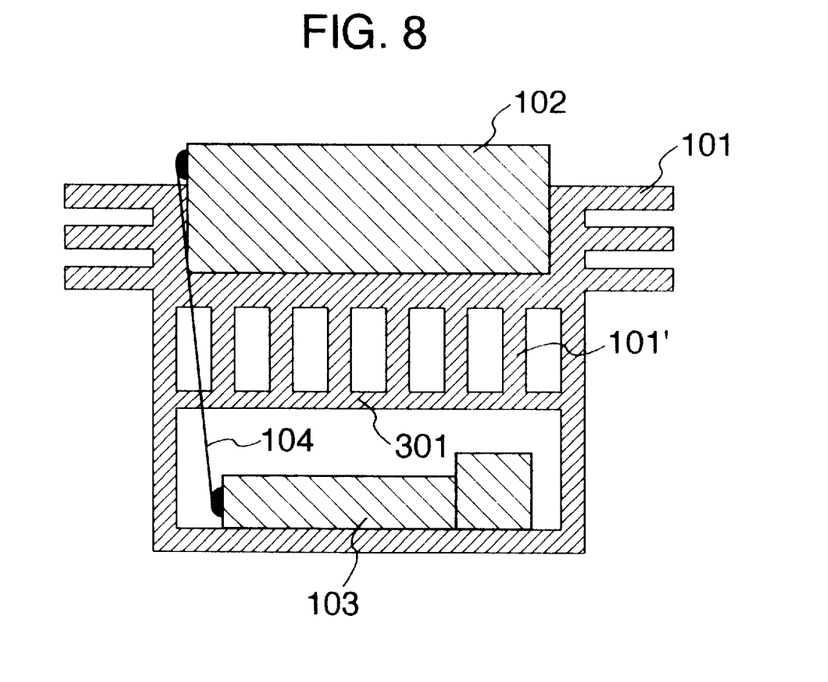
FIG. 8 shows a third embodiment of the present invention.

FIG. 8 shows a third embodiment of the electric apparatus of the present invention, by a cross-sectional view taken along a line perpendicular to both the side face of the apparatus opposed to a plurality of fin parts and the fin mounting surface.

The radiation fin 101 also partially forms part of the casing and a group of electric parts B103 are mounted in the interior of the casing. The electric part A102 providing a relatively large quantity of heat generation is mounted outside of the heat radiating fin also used as part of the casing, so that three surfaces of the electric part are surrounded by the radiation fin 101. The radiation fin 101 has such a structure that extends in a direction perpendicular to the sheet plane and that is open at its both sides. Provided in the interior of the casing is a partition wall 301 between the part A102-mounted side and the part-group B103 mounted side. Further formed between the partition wall 301 and the side wall having the electric part A102 mounted thereon are a plurality of fin parts 101' extended parallel to each other to connect the both walls. Spaces defined by the both side walls and fin parts are designed to extend in the direction perpendicular to the paper sheet plane, and are open to the exterior at their both sides to allow air as the heat conductive medium to flow therethrough. That is, provided in the interior of the casing along the flow direction of the heat conductive medium are partition walls (the partition wall 301 and fin parts 101') which divide the interior of the casing into a plurality of space zones.

The group of electric parts B103 including an electric part as an electromagnetic noise generation source or an electric part easily susceptible to electromagnetic noise, is mounted inside of the casing. The electric part A102 and the group of electric parts B103 are electrically connected by the electric wire 104.

The radiation fin 101 has such a structure as to be contacted by 3 surfaces of the electric part A102, with the result that a contact area between the electric part A and heat radiating fin is increased to thereby enhance the heat radiating effect. Such a radiation fin can be manufactured by using the manufacturing method already mentioned in the first embodiment.

Due the provision of the partition wall 301, the heat conductive medium flowing between the plurality of fin parts 101' will not come into contact with the group of electric parts B103. For this reason, heat can be efficiently radiated from the electric part A102 providing a relatively large quantity of heat generation while avoiding any disturbance of the heat conductive medium flow. When the radiation fin 101, fin parts 101' and partition wall 301 are integrally molded, the numbers of parts and assembling steps can be reduced.

In accordance with the present embodiment, there can be provided an electric apparatus which has good heat radiating and electromagnetic shielding performances and also is made small in size.

Figure 9:
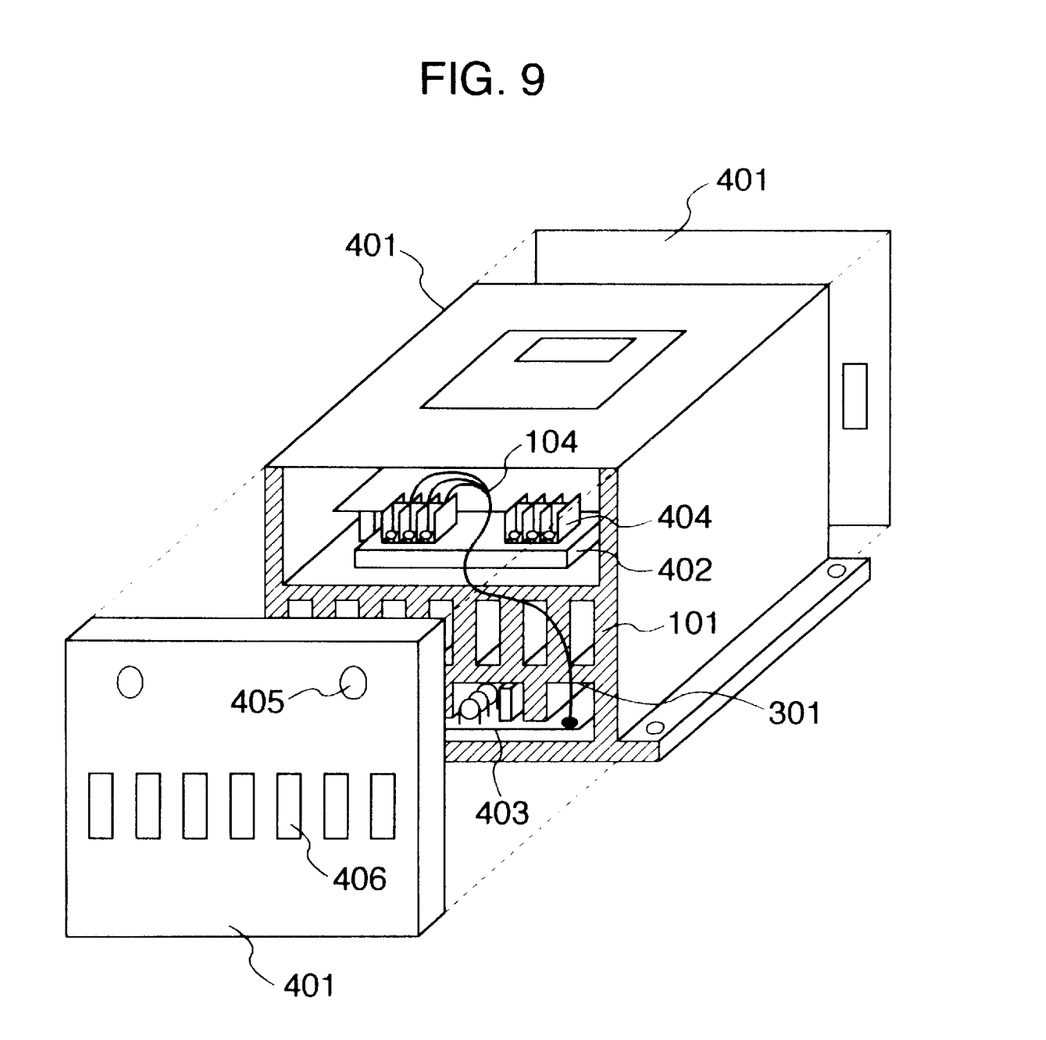
FIG. 9 shows a fourth embodiment of the present invention.

FIG. 9 is a diagram when the electric apparatus of the present invention is applied to an inverter apparatus. In the drawing, reference numeral 401 denotes a cover, numeral 402 denotes an inverter, 403 denotes a noise filter, 404 denotes a terminal base, 405 denotes a through hole, and 406 denotes a slit. The inverter 402 is mounted on the heat radiation fin 101, and the noise filter 403 is disposed below the inverter 402 as spaced by the fin parts and partition wall 301. Further, the noise filter 403 is electrically connected by the electric wire 104 to the terminal base 404 provided on the inverter side and to an input of the inverter 402. The cover 401 is mounted to cover inlets and outlets of the heat conductive medium and also to cover an upper side of the inverter 402.

A power supply line is passed through the through hole 405 made in the cover 401, guided into the interior of the apparatus, and then connected to an input of the noise filter 403. Further, the inverter 402 is electrically connected to such a load as a motor by the power supply line passed through the through hole 405. Since the terminal base 404 is provided in the upper part of the apparatus, an assembling worker can easily conduct wiring works.

The radiation fin 101 is used also as a part supporting member and as a casing. Further, the shielding effect of the fin and partition wall 301 causes the inverter 402 and noise filter 403 to be less susceptible to electromagnetic interference.

Since a current is switched in the inverter 402, the inverter generates more heat and electromagnetic noise. Heat generated by the inverter is discharged out of the apparatus via the radiation fin 101. Further, conductive noise propagating via the electric line is eliminated by the noise filter 403, while radioactive and inductive electromagnetic noise is shielded by the radiation fin 101 surrounding the inverter.

When the radioactive electromagnetic noise has a high frequency, a longest dimension of the opening of the radiation fin 101 is designed to make small or the cover 401 is made of material having a high electromagnetic shielding effect to shield the electromagnetic noise with use of the radiation fin 101 and cover 401. The cover 401 is mounted so as to be brought into electrically positive contact with the radiation fin 101.

Figure 10:
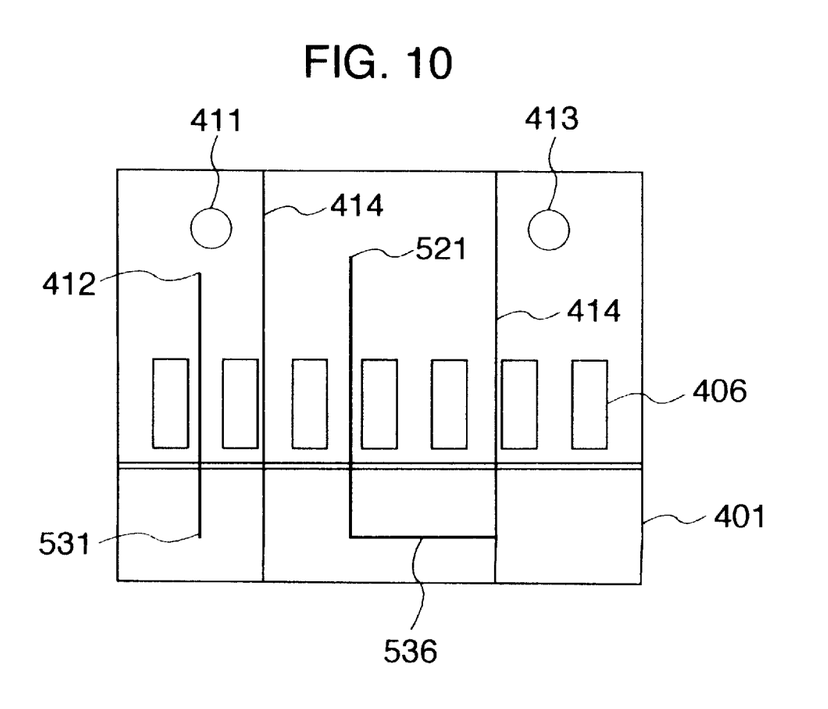
FIG. 10 shows an example of a cover part.

A front view of an example of the cover 401 is shown in FIG. 10. A through hole 411 for passage of the power line therethrough is used to pass a cable leading from a commercial power source therethrough and then to guide it into the inside of the apparatus. The power line is connected to a power line input terminal 412 which in turn is connected by a electric line to a filter input terminal 531 provided under the terminal 412. A filter output terminal 536 leading to an output of the noise filter 403 is connected to an inverter input terminal 521 positioned above the terminal 536. And an output of the inverter is connected to another device via an inverter output through hole 413.

The electric line connecting the filter output terminal 536 and inverter input terminal 521 as well as the electric line leading from the output of the inverter are so-called 'dirty' lines. The electric line connecting the power line input terminal 412 and filter input terminal 531 is a so-called 'clean' line, that is, a less-noise line which noise is removed by the noise filter 403. When these lines are disposed close to each other, the once-removed noise is again superimposed on the clean line. To avoid this, in FIG. 10, a shielding plate 414 for preventing electromagnetic induction between the lines is provided to extend vertically to the cover 401. The shielding plate 414 may comprise an integral molded product made of the same material as the cover 401 if the material is electrically conductive. The shielding plate 414 also has a function of increasing the rigidity or strength of the cover 401. When the electric lines are disposed between the fin parts of the heat radiation fin in place of the provision of the shielding plate 414, electromagnetic induction can be avoided.

Figure 11:
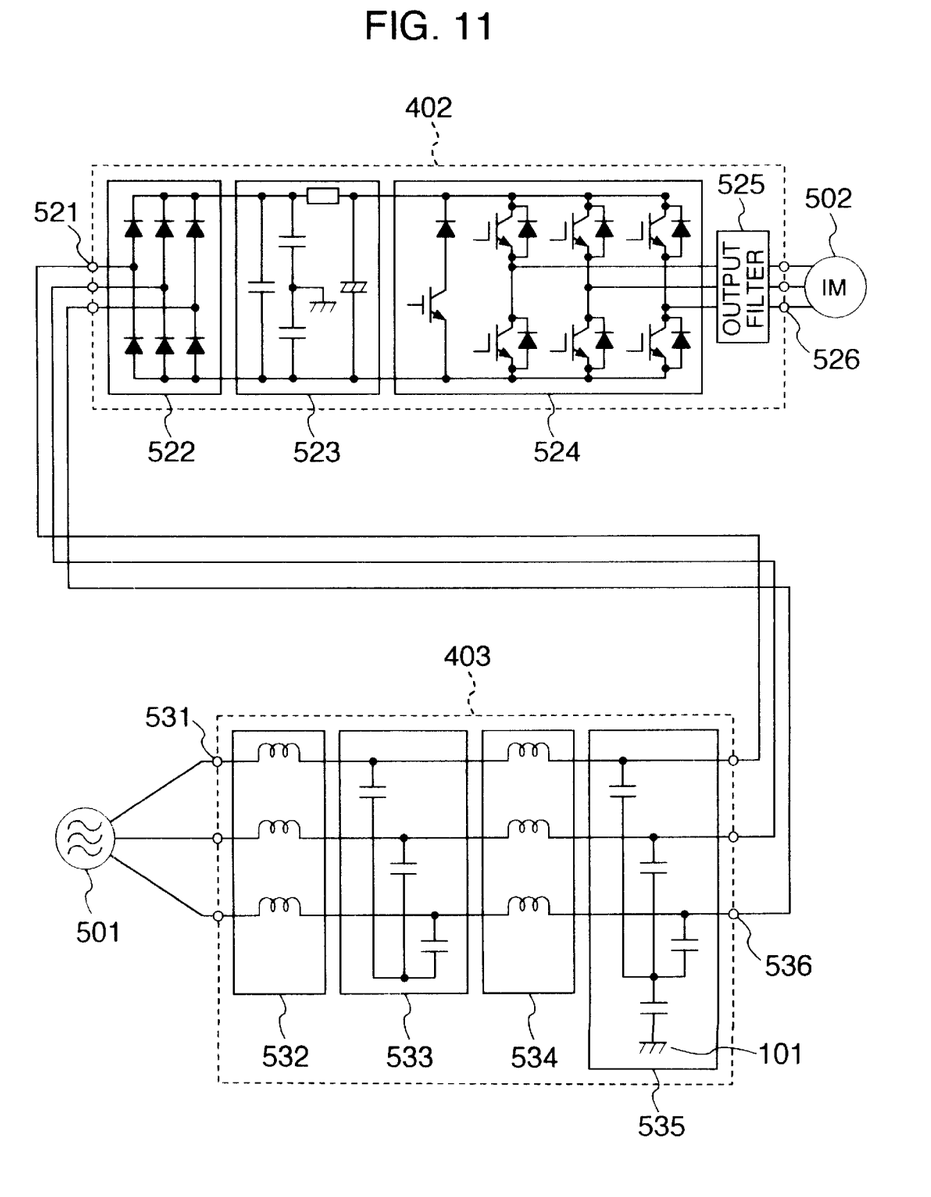
FIG. 11 is a circuit diagram of a noise filter and an inverter in FIG. 9.

FIG. 11 is a circuit diagram of the noise filter and inverter shown in FIG. 9, in which reference numeral 501 denotes a power source, numeral 502 denotes a motor, 402 denotes an inverter, and 403 denotes a noise filter.

The power source 501 is connected to the filter input terminal 531, and the filter output terminal 536 is connected to the inverter input terminal 521. Further, an inverter output terminal 526 is connected to the motor 502.

The noise filter 403 is made up of a cut core 532, an X capacitor 533, a choke coil 534 and a Y capacitor 535. The Y capacitor 535 is connected at its grounding terminal to the heat radiation fin. These elements act to remove conduction noise invaded from the power source side and noise propagated from the inverter 402 and to transmit only power of a desired frequency to the inverter 402.

The inverter 402 made up of a diode bridge 522 for rectifyingly converting an A.C. voltage to a D.C. voltage, a smoothing capacitor 523 for smoothing a waveform of the D.C. voltage immediately after its conversion, a switching element section 524 for switching the D.C. voltage to generate an A.C. output of an arbitrary frequency, and an output filter 525 including the cut core and the like.

The electric line connecting the filter output terminal 536 and inverter input terminal 521 becomes a noise generation source because its noise components are not removed. Further, the inverter 402 and the noise filter 403 also become noise generation sources. The noises generated by these elements are shielded by the radiation fin 101 and cover 401 as shown in FIG. 9, there is a less possibility that the noises are radiated externally out of the apparatus.

As has been explained in the foregoing, in the inverter apparatus to which the present invention is applied, the radiation fin 101 has, in addition to the heat radiating function, another function as a casing, a supporting member and an electromagnetic shielding material. Accordingly, the inverter apparatus can be made small in the size and the numbers of parts and assembling steps, be improved in its electromagnetic compatibility, and be made low in its costs.

In accordance with the present invention, the heat radiation fin, in addition to the heat radiating function, also partially or wholly functions as the casing for surrounding whole or some of the electric parts, and also functions as the supporting member for supporting electric parts. This enables reduction of the number of parts including the casing and the supporting part. Further, this enables reduction of the number of assembling steps in the electric apparatus. In addition, since the surface area of the fin can be increased, a heat radiation efficiency per unit volume of the apparatus can be improved and the overall apparatus can be made small in size.

Furthermore, when the heat radiation fin is made of electrically conductive material or magnetic material, the radiation fin functions also as the electromagnetic shielding material. This enables reduction of electromagnetic mutual interference between the electric parts separated by the heat radiating fin parts, improvement of its electromagnetic immunity, and reduction of electromagnetic wave radiated from the apparatus.

In addition, when the heat radiation fin is made of elastic material, the radiation fin also functions as a vibration absorbing material and as a sound damping material. This enables suppression of mechanical vibration and noise in the electric apparatus and electric parts.

What is claimed is:

1. An electric apparatus comprising a plurality of electric parts and a casing made of electrically conductive material for accommodating therein or mounting thereon the plurality of electric parts, wherein said casing having a cavity therein is provided with a plurality of projections for radiating heat generated by said electric parts, and said casing is provided therein with openings for allowing a heat conductive medium to flow into and out of the casing, wherein at least one of said plurality of electric parts which provides a relatively large quantity of heat radiation is mounted outside of said casing, and wherein at least one of said plurality of electric parts which generate electromagnetic noise or is easily susceptible to electromagnetic noise influence is mounted inside of said casing.

2. An electric apparatus as set forth in claim 1, wherein one or some of said plurality of electric parts are mounted to said projections provided inside of said casing.

3. An electric apparatus as set forth in claim 1, wherein one or some of said plurality of electric parts are mounted in a space or spaces defined by said projections provided inside of said casing.

4. An electric apparatus comprising a plurality of electric parts and a casing made of electrically conductive material for accommodating therein or mounting thereon the plurality of electric parts, wherein said casing having a cavity therein is provided therein with openings for allowing a heat conductive medium to flow into and out of said casing therethrough, and said casing is provided therein with a partition wall which is made of electrically conductive material for dividing an interior of said casing into a plurality of zones along a direction of a flow of said heat conductive medium, wherein at least one of said plurality of electric parts which provides a relatively large quantity of heat radiation is mounted outside of said casing, and wherein at least one of said plurality of electric parts which generate electromagnetic noise or is easily susceptible to electromagnetic noise influence is mounted in a desired one of said plurality of zones of the interior of said casing.

5. An electric apparatus as set forth in claim 1, wherein said at least one of said plurality of electric part which provides a relatively large quantity of heat radiation is electrically connected to said at least one of said plurality of electric parts which generates electromagnetic noise or is susceptible to electromagnetic noise.

6. An electric apparatus as set forth in claim 4, wherein said at least one of said plurality of electric part which provides a relatively large quantity of heat radiation is electrically connected to said at least one of said plurality of electric parts which generates electromagnetic noise or is susceptible to electromagnetic noise.

7. An electric apparatus as set forth in claim 4, wherein said partition wall is disposed between a side of said casing where said at least one of said plurality of electric parts which provides a relatively large quantity of heat radiation is mounted thereon and a side of said casing where said at least one of said plurality of electric parts which generates electromagnetic noise or is susceptible to electromagnetic noise is mounted.

8. An electric apparatus comprising a plurality of electric parts and a casing made of electrically conductive material for accommodating therein said plurality of electric parts, said casing delimiting a cavity therein, said casing having at least one of (a) a plurality of projections integral with said casing and projecting from a wall of said casing into said cavity for radiating heat generated by said electric parts and (b) a partition wall integral from said casing and extending at least one wall of said casing so as to divide said cavity of said casing into a plurality of zones, said casing being provided with openings for allowing a heat conductive medium to flow into and out of said casing, said plurality of zones being arranged along a direction flow of said heat conductive medium.

9. An electric apparatus as set forth in claim 8, wherein one of said plurality of electric parts which generates electric noise or is easily susceptible to electromagnetic noise influence is mounted inside of said casing.

10. An electric apparatus as set forth in claim 9, wherein one of said plurality of electric parts which provides a relatively large quantity of heat radiation is mounted outside of said casing.

* * * * *